(12) United States Patent
Seguin (10) Patent No.: US 8,781,820 B2
(45) Date of Patent: Jul. 15, 2014

(54) MULTI BAND AUDIO COMPRESSOR DYNAMIC LEVEL ADJUST IN A COMMUNICATIONS DEVICE

(75) Inventor: Chad G. Seguin, Morgan Hill, CA (US)

(73) Assignee: Apple Inc., Cupertino, CA (US)

( * ) Notice: Subject to any disclaimer, the term of this patent is extended or adjusted under 35 U.S.C. 154(b) by 830 days.

(21) Appl. No.: 12/357,312

(22) Filed: Jan. 21, 2009

(65) Prior Publication Data

US 2009/0254339 A1 Oct. 8, 2009

Related U.S. Application Data

(60) Provisional application No. 61/042,622, filed on Apr. 4, 2008.

(51) Int. Cl.
*G10L 19/00* (2013.01)

(52) U.S. Cl.
USPC ........... 704/212; 704/500; 704/501; 704/502; 704/503; 704/504

(58) Field of Classification Search
None
See application file for complete search history.

(56) References Cited

U.S. PATENT DOCUMENTS

| | | | | |
|---|---|---|---|---|
| 5,946,652 | A * | 8/1999 | Heddle | 704/230 |
| 7,606,705 | B2 * | 10/2009 | Johnson et al. | 704/229 |
| 2002/0123885 | A1 * | 9/2002 | Sluijter et al. | 704/201 |
| 2004/0247993 | A1 * | 12/2004 | Johnson et al. | 429/50 |
| 2006/0270467 | A1 * | 11/2006 | Song et al. | 455/570 |
| 2006/0281485 | A1 * | 12/2006 | Johnson et al. | 455/552.1 |

OTHER PUBLICATIONS

Companding. (n.d.). In Wikipedia. Retrieved Oct. 15, 2012, from http://en.wikipedia.org/wiki/Companding.
Dynamic range compression. (n.d.). In Wikipedia. Retrieved Oct. 15, 2012, from http://en.wikipedia.org/wiki/Dynamic_range_compression.

* cited by examiner

*Primary Examiner* — Leon Saint Cyr
(74) *Attorney, Agent, or Firm* — Park, Vaughan, Fleming & Dowler LLP (57) ABSTRACT

An uplink or downlink audio processor contains a multi band compressor that receives an input, uplink or downlink, audio signal. The multi-band compressor has a band splitter that splits the input audio signal into a number of different band signals. Each band signal is input to a respective compressor block, which is independently programmable so that its audio frequency response (a) differs from a linear response in at least two non-overlapping windows of its input signal, and (b) differs from the frequency response of another one of the compressor blocks. Other embodiments are also described and claimed.

11 Claims, 5 Drawing Sheets

MULTI BAND AUDIO COMPRESSOR DYNAMIC LEVEL ADJUST IN A COMMUNICATIONS DEVICE

This application claims the benefit of the earlier filing date of U.S. provisional application Ser. No. 61/042,622, filed Apr. 4, 2008, entitled "Audio Signal Processing in a Handheld Wireless Communications Device".

An embodiment of the invention relates to handheld wireless audio communications devices that have a built-in processor for enhancing an audio signal. Other embodiments are also described.

BACKGROUND

Handheld electronic devices and other portable electronic devices are becoming increasingly popular. Examples of handheld devices include handheld computers, cellular telephones, media players, and hybrid devices that include the functionality of multiple devices of this type. Popular portable electronic devices that are somewhat larger than traditional handheld electronic devices include laptop computers and tablet computers.

Handheld wireless communications devices often have several functions that involve digital audio signal processing. For example, consider their use as a mobile telephony device (e.g., a cellular telephone handset). Following a call set up or connection phase, a simultaneous two-way voice conversation between a local user of the device and another (remote) user in a telephone call may be enabled as follows.

A so-called uplink chain in the device is responsible for digitizing the local user's speech that has been detected by a built-in microphone. This may result in a raw digital audio signal or bit stream, e.g. a pulse code modulated, PCM, audio signal or bitstream. The uplink chain then digitally codes the raw signal, to remove its redundant content. For instance, a 64 kbits/sec raw speech bitstream may be encoded as a 14 kbits/sec bitstream, without causing a noticeable drop in sound quality. Next, the uplink chain modulates a RF carrier signal with the coded signal (and other information regarding the call). An antenna of the device is then driven with the modulated RF carrier. The local user's speech is thus transmitted to the cellular telephone network.

To enable the above-mentioned two-way conversation, a downlink chain is provided in the device, so that the local user can hear the remote user's speech. The downlink chain operates in parallel with or simultaneously as the uplink chain, to enable the real-time two-way conversation. The downlink chain may essentially perform the reverse of the uplink chain's operations. Thus, an antenna of the device outputs a downlink RF signal sent by the cellular telephone network. The downlink chain then demodulates the downlink RF signal to yield a so-called baseband signal. The latter contains a coded audio signal, which includes an encoded version of the captured speech of the remote user. The coded audio signal is decoded (e.g., into a PCM bitstream), converted to analog format and then played to the local user, through a receiver or speaker of the device. To render higher quality or better sound when an audio signal is played back, various signal processing operations may be performed on the digital audio signal in both the downlink and uplink chains. These may include noise filtering or noise suppression (sometimes referred to as noise cancellation), gain control, dynamic range compression (or simply compression), energy limiting, and echo cancellation.

Compression results in loud sounds over a certain threshold being reduced in level, while quiet sounds remain untreated. In this way, it reduces the dynamic range of an audio signal. This may be done to improve audibility in noisy environments. For example, a comfortable listening level for quiet sounds in a noisy environment makes the loud sounds too loud. Compression reduces the level of the loud sounds (by reducing the gain for those sounds), but not the quiet sounds, so that volume can be raised to a point where the quiet sounds are more audible without the loud sounds being too loud. A compressor decreases gain (level) of an audio signal if its amplitude exceeds a certain threshold. Typically, an input/output ratio is defined that determine the amount of compression. For example, a 4:1 ratio means that an input signal overshooting a threshold by 4 dB will leave the compressor 1 dB above the threshold. Also, in practice, a compressor exhibits a delay before its output level is actually reduced to the required level—this is referred to as the attack phase.

Somewhat similar to a compressor, a hard limiter also limits loud sounds. However it does so in a much more abrupt manner, in effect exhibiting a much higher ratio and a much shorter attack phase. Hard limiting is typically used as a safety device than as a sound-sculpting tool.

SUMMARY

An embodiment of the invention is an audio communications device having an uplink or downlink audio processor. The audio processor has a multi band compressor that receives an input uplink or downlink audio signal. The multi-band compressor has a band splitter that splits the input audio signal into multiple, different band signals. The compressor also has multiple compressor blocks, one for each band signal. Each of the compressor blocks has multiple input thresholds that are programmable. In one embodiment, the input thresholds include at least two of the following: (1) a strong limit input threshold across which the compressor block strongly reduces gain applied to its input signal, (2) an expansion threshold across which the compressor block increases gain applied to the input signal, (3) a weak limit input threshold across which the compressor block weakly reduces gain to the input output signal, and (4) a no compression threshold across which gain applied to the input signal remains unchanged (linear operation).

The above summary does not include an exhaustive list of all aspects of the invention. It is contemplated that the invention includes all systems and methods that can be practiced from all suitable combinations of the various aspects summarized above, as well as those disclosed in the Detailed Description below and particularly pointed out in the Claims. Such combinations may have particular advantages not specifically recited in the above summary.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one.

DETAILED DESCRIPTION

Several embodiments of the invention as methods and circuitry for audio signal processing in a communications device are explained below, with reference to FIGS. 4-7. Before doing so however, the Overview section describes an example communications device in some detail, in connection with FIG. 1 and FIG. 2, including a description of several relevant electronic hardware and software components that make up the device. This is followed by the Audio Processing Capabilities section, which focuses on the uplink and downlink audio processors (in connection with FIG. 3). Note that although the particular communications device used here to illustrate certain embodiments of the invention is a type of handheld wireless device, such as a cellular phone or a smart phone, other types of communications devices such as a desktop computer or a laptop/notebook computer that has telephone call communications capability (e.g., using Voice Over Internet Protocol, VOIP) can also benefit from the audio signal processing techniques described here.

Whenever the shapes, relative positions and other aspects of the parts described in the embodiments are not clearly defined, the scope of the invention is not limited only to the parts shown, which are meant merely for the purpose of illustration. Also, while numerous details are set forth, it is understood that some embodiments of the invention may be practiced without these details. In other instances, well-known circuits, structures, and techniques have not been shown in detail so as not to obscure the understanding of this description.

Overview

Figure 1:
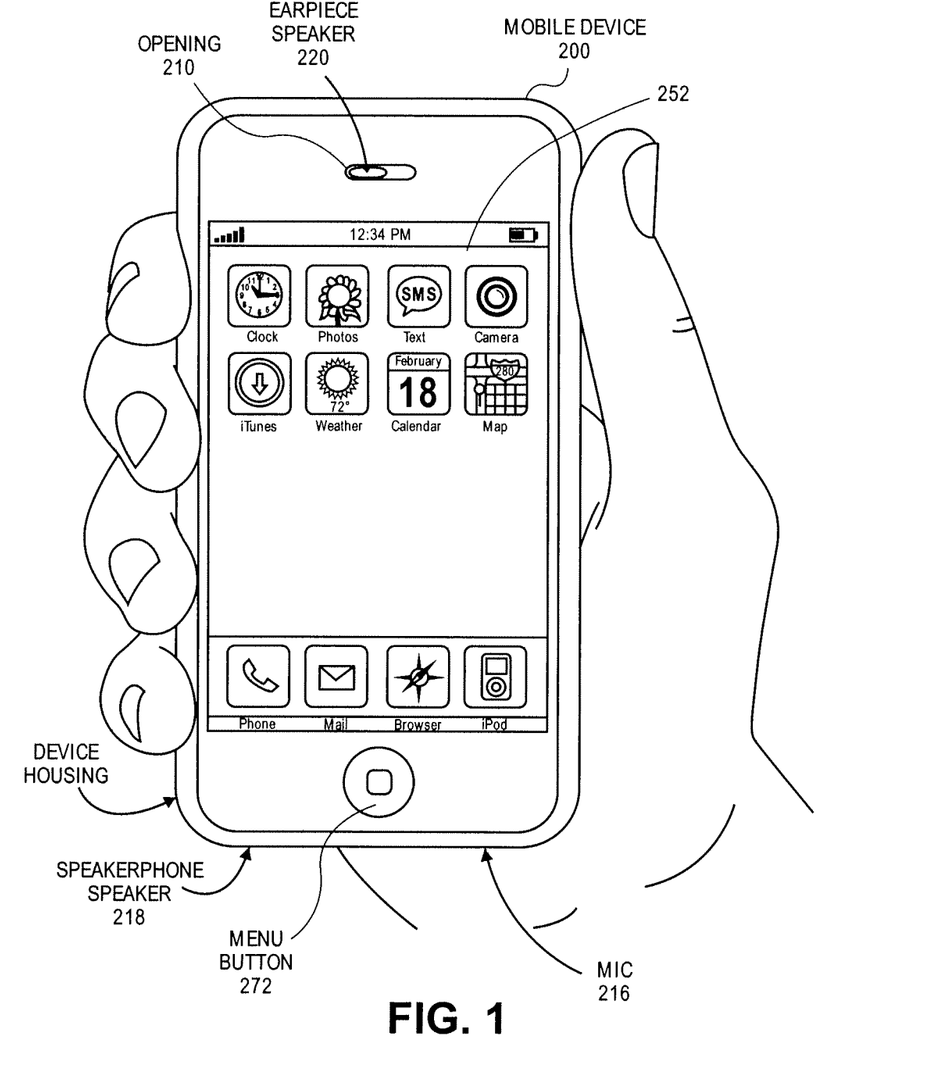
FIG. 1 is a perspective view of an example handheld wireless communications device in which certain embodiments of the invention can be implemented.

FIG. 1 is a perspective view of an example handheld wireless communications device 200 in which certain embodiments of the invention can be implemented. Note that the particular device 200 shown and described here is just an example—the concept of dynamic level adjusting of a multi band compressor described further below may be implemented in other types of communications devices, e.g. handheld wireless devices that do not use a touch screen display, or ones that do not have a chocolate bar type housing.

The device 200 shown and described here has similarities to the iPhone™ device by Apple Inc. of Cupertino, Calif. Alternatively, it could be another portable or mobile, handheld multi-function electronic device or smart phone that has the audio signal processing enhancements described below. The device 200 in this case has a fixed, single piece housing, sometimes described as a candy bar or chocolate bar type, in which the primary mechanism for visual and tactile interaction with the user is a touch sensitive display screen 252. An alternative to this type of mobile device is one that has a moveable, multi-piece housing such as a clam shell design or one with a sliding, physical key pad as used by other smart phone manufacturers. The touch screen 252, or in other cases a simple display screen, will display typical smart phone features, such as visual voicemail, web browsing, email functions, digital camera pictures, as well as others. The example in FIG. 1 shows the touch screen 252 displaying the home or main menu of a graphical user interface that allows a user of the device 200 to interact with various application programs that can run in the device 200. The home menu displays icons or graphical images that represent application programs, files, and their associated commands as shown. These may include windows, fields, dialog boxes, menus, virtual buttons, cursors, scrollbars, etc. The user can select from these graphical images or objects by touching the surface of the screen 252 with her finger, in response to which the associated application program will be launched.

The device 200 has a wireless telephony function that enables its user to receive and place audio and/or video calls. At the upper end of the housing, an opening 210 is formed through which downlink audio during a call is emitted from an earpiece speaker 220. At a bottom end portion of the device 200, a microphone 216 is located to pickup the near end user's speech, which is then transmitted in an uplink signal to the far end user, during the call. In some cases, the device 200 also has a speakerphone speaker 218 built into the device housing, which allows the user to conduct a call without having to hold the device 200 against her ear. A proximity sensor 254 (see also FIG. 2) may be integrated in the mobile device 200, so as to detect proximity of the touch screen 252 to the user's face or head, and thereby automatically disable input through the touch screen 252 during a handset mode call.

Figure 2:
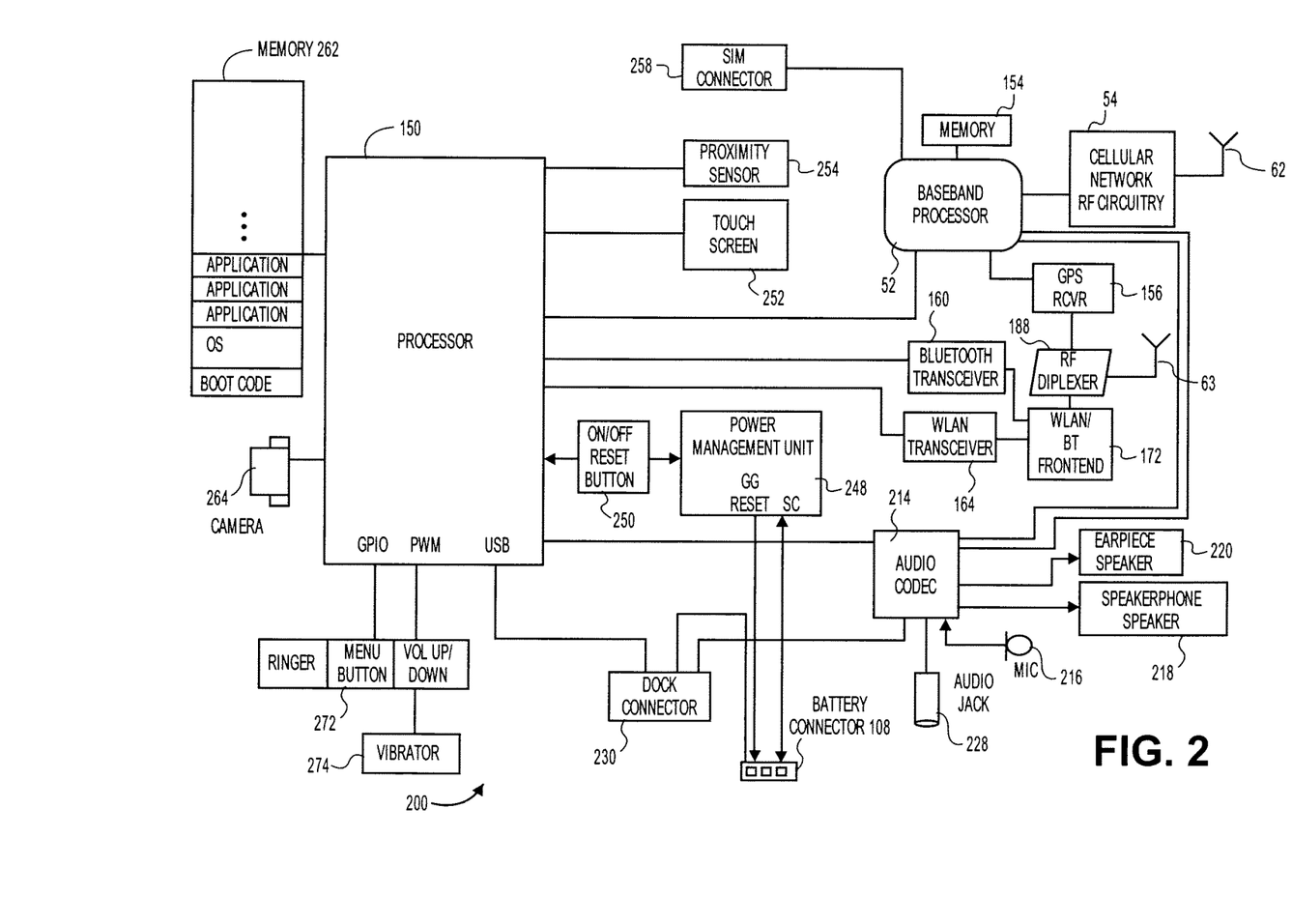
FIG. 2 is a block diagram showing internal circuit components of the example wireless handheld communications device of FIG. 1.

FIG. 2 is a block diagram of several internal circuit components of the example wireless handheld communications device 200, presented as an overview of the device 200. The device 200 has several built in electro-acoustic transducers including for example, a microphone 216, a receiver (ear speaker or earpiece) 220, and a speaker (speakerphone) 218. The microphone 216 provides an output analog audio signal, whereas the receiver and speaker receive input analog audio signals. Collectively, these are referred to here as the analog acoustic transducer signals. An audio coder-decoder (codec) 214 acts as an interface to the analog input of the microphone and the analog outputs of the receiver and speaker, by providing any and all analog amplifiers and other analog signal conditioning circuitry that is needed for conditioning the analog acoustic transducer signals. The codec 214 may be a separate integrated circuit (IC) package.

In one example, the codec 214 operates in two modes. It can be configured into either mode, by control signals or programming supplied by an applications processor 150 over an I2C bus or other component bus. In one mode, referred to as media player mode, the device 200 is operating as a digital media player (e.g., an MP3 player that is playing back a music file stored in the device 100). In that mode, the codec 214 applies analog to digital and digital to analog conversion to the analog acoustic transducer signals to generate corresponding digital signals. In this mode, the codec 214 supplies the digitized microphone signal to an applications processor 150, and converts a digital audio signal from the applications processor 150 into analog form and then applies it to the receiver and/or speaker for play back.

In another mode, referred to as call mode, the device 200 is operating as a mobile telephony device (e.g., allowing its user to be in a real time audio conversation with another remote user during a cellular telephone call). In that mode the codec 24 acts as an analog pass through with no digital conversion, so that the analog acoustic transducer signals are passed through, with perhaps some analog amplification or buffering, between the baseband processor 52 and the acoustic transducers (signal line 152 outputs the microphone signal, while signal line 154 inputs the receiver or speaker signal).

The baseband processor 52 includes an interface to receive and transmit signals from and transmitted to a cellular network. The baseband processor, which may be a separate integrated circuit (IC) package, has an input port to receive a downlink signal, and an output port to transmit an uplink signal. These may be in a band around 26 MHz, for example, but alternatively they may be at other frequency bands that are considered intermediate (between baseband and RF at the antenna input). The downlink signal may be ready to be upconverted into a cellular network RF signal, such as a long range wireless communications signal that is directed to a cellular telephone network's base station, for example in a 3G or Universal Mobile Telecommunications System, UMTS, band, e.g. 850 MHz, 900 MHz, 1800 MHz, and 1900 MHz bands. Similarly, the uplink signal that is input to the baseband processor has been downconverted from such an RF band, down to intermediate frequencies, e.g. 26 MHz band.

The downlink/uplink RF signal that is input/output from the baseband processor may be downcoverted/upconverted into the antenna's radiation band, by a frequency downconverter/upconverter that is external to the baseband processor IC package (e.g., as part of the RF transceiver IC package 54). Thus, the signal at the input/output port of the baseband processor may be an intermediate frequency (IF) signal that is above the baseband frequencies but below the cellular network band frequencies (so called RF frequencies here). As an alternative, the RF up conversion and down conversion may be direct, from and to baseband, rather than going through an intermediate frequency.

The baseband processor may perform known cellular baseband processing tasks including cellular protocol signaling, coding and decoding, and signaling with the external RF transceiver. These together with the RF processing in the external RF transceiver may be referred to as the radio section of the device 200. The base band processor 52 may be programmable, in accordance with software that has been encoded and stored in its associated non-volatile memory 154. Permission to access the cellular network may be granted to the near end user in accordance with a subscriber identify module, SIM, card that is installed in the mobile device 200 to connect with the SIM connector 258.

The device 200 and the cellular network may be in agreement with respect to a particular voice coding (vocoding) scheme that is to be applied to the raw digital audio signal from the microphone (uplink signal) which is transmitted by the device 200. Similarly, an agreement is needed for the particular voice decode scheme which the device 200 should be applying to a downlink signal. Any known voice coding and decoding scheme that is suitable for the particular wireless communications protocol used may be adopted. The voice coding and decoding sections of the baseband processor may also be considered to be part of the radio section of the device 200.

The device 200 may also have further wireless communications capability, to provide a global positioning system, GPS, service, a Bluetooth link, and a TCP/IP link to a wireless local area network. To this end, a Bluetooth transceiver 160 is provided together with a wireless local area network, WLAN, transceiver 164, which provide additional wireless communication channels for the device 200. These two channels may share an antenna 63 for short range wireless communications (e.g., in accordance with a Bluetooth protocol and/or a wireless local area network protocol). An RF diplexer 188 has a pair of RF ports that are coupled to the antenna 63. One of the RF ports is used for GPS services, which a GPS receiver integrated circuit 156 uses to obtain GPS data that allows the mobile device 200 to locate itself to its user. The other RF port of the diplexer 188 is coupled to an RF front end 172 that combines Bluetooth and WLAN RF signals.

The cellular network, GPS, Bluetooth, and WLAN services may be managed by programming the applications processor 150 to communicate with the base band processor 52, Bluetooth transceiver 160, and wireless transceiver 164 through separate, component buses. Although not shown, there may also be separate component buses connecting the base band processor 52 to the Bluetooth transceiver 160 and WLAN transceiver 164, to enable the latter transceivers to take advantage of the audio processing engine available in the base band processor 52, to, for example, conduct a wireless voice over IP call (using the WLAN transceiver 164) and to allow the near end user to conduct the call through a wireless headset (using Bluetooth transceiver 160).

The so-called power hungry components of the mobile device 200 may include the base band processor 52, the applications processor 150, the touch screen 252, and the transmit RF power amplifiers that are part of the RF circuitry 54. These are coupled to and are monitored by a power management unit 248. The power management unit 248 may monitor power consumption by individual components of the device 200 and may signal power management commands to one or more of the components as needed so as to conserve battery energy and control battery temperature.

Other lower level hardware and functionality of the mobile device 200 include an on/off or reset button 250, a vibrator 274 used to indicate the ringing signal of an incoming call, an audio ringer, a physical menu button, and a volume up/down button (collectively referred to as circuit elements 272 which may be coupled to output pins of the processor 150 as shown). The mobile device 200 may also have a dock connector 230 that communicates with a USB port of the processor 150, allowing the device 200 to, for example, synchronize certain files of the user with corresponding files that are stored in a desktop or notebook personal computer of the same user. The dock connector 230 may also be used to connect with a power adapter or other electricity source for charging the battery (via the battery connector 108).

In a further embodiment, the mobile device 200 may have digital camera circuitry and optics 264 that are coupled to the processor 250, enabling the mobile device to be used as a digital still or video camera.

Having described the lower level components of the mobile device 200, a brief discussion of the higher level software functionality of the device is in order. As suggested above, the device 200 may be essentially considered to be a computer whose processor 150 executes boot code and an operating system (OS) stored in the memory 262 within the device. Running on top of the operating system are several application programs or modules that, when executed by the processor 150, manage at a high level the following example functions: placing or receiving a call (phone module); retrieving and displaying email messages (mail module); browsing the web (browser module); and digital media playback (iPod™ player module). Additional applications or widgets may be executed by the processor 150, such as those depicted in FIG. 1, including a clock function, SMS or text messaging service application, a weather widget, a calendar application, a street map navigation application, and a music download service application (the iTunes™ service).

Audio Processing Capabilities

Figure 3:
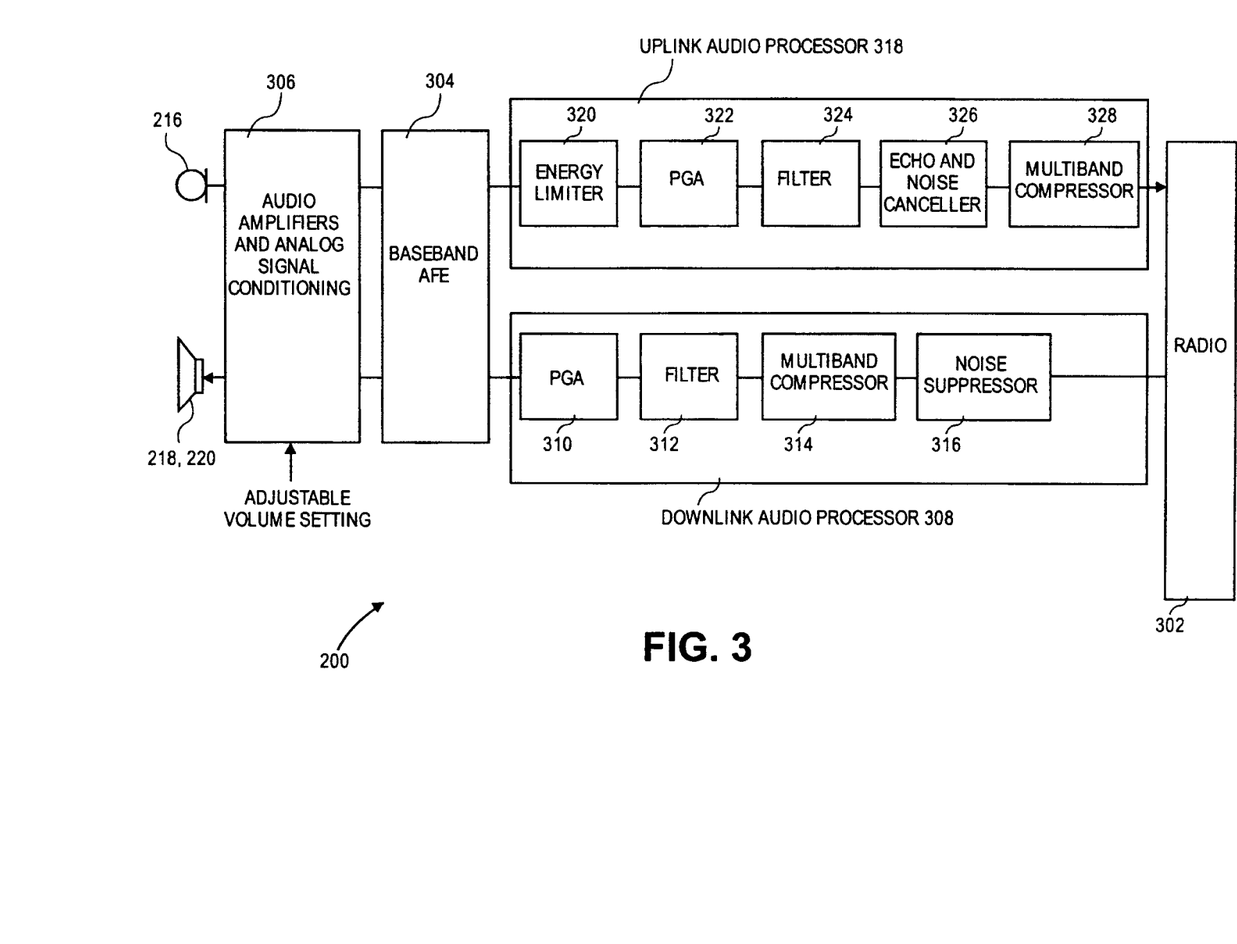
FIG. 3 depicts example uplink and downlink audio processors integrated in a wireless handheld communications device, that can be used to implement the multi band compressor features described here.

The device 200 has a digital audio signal processing structure between its radio section 302 (responsible for interfacing with the cellular phone network for example or a wireless local area network), and its baseband analog front end (BB AFE) 304, as depicted in FIG. 3. The AFE 304 interfaces with the acoustic transducers of the device 200, namely the microphone 216 and earpiece speaker 220, by performing the needed analog to digital, A/D, and digital to analog, D/A, conversion. A block of audio amplifiers and other analog audio signal conditioning circuitry 306 are part of the analog interface with the microphone 216 and speakers 218, 220, which generates a speaker driver signal whose strength is based on an adjustable volume setting received as input. The latter may be a digital signal set by the user's manual actuation of a volume up/down button of the device 200 (see FIG. 2, block 272).

The digital signal processing structure includes a downlink signal processing chain or downlink audio processor 308 that has an input coupled to the radio section 302 and an output feeding the AFE 304. The downlink audio processor 308 may perform several digital signal processing operations upon the decoded, digital or sampled voice signal or bit stream (also referred to as the downlink baseband or audio signal), in order to enhance the latter. These may include a combination of one or more of the following operations performed on the downlink audio signal: adjust its gain using a downlink programmable gain amplifier (PGA) 310; apply general filtering to it using a downlink programmable digital filter 312; perform multi-band audio compression upon it using a downlink multi-band compressor 314; and reduce noise using a noise suppressor 316. Not all of these operations are needed in the downlink chain—for example, the noise suppressor 316 may be omitted from the downlink chain. The downlink audio signal received from the radio section 302 may be in the form of a pulse code modulated bit stream.

The device 200 may also perform enhancement operations on an uplink audio signal. This is done using an uplink audio processor 318 that acts upon an uplink digital voice signal or bit stream received from the microphone 216 via the AFE 304 (prior to the voice coding of the signal for transmission). In the example of FIG. 3, the uplink audio processor 318 includes the following signal processing chain: an energy limiter 320, an uplink PGA 322; an uplink programmable digital filter 324; an echo and noise canceller 326 (including a noise suppressor block); and an uplink multi-band compressor 328. However, not all of the signal processing blocks may be needed in every instance.

The downlink audio processor 308 and the uplink audio processor 318 may each be implemented as a separate programmed processor, or a separate combination of a programmed processor and dedicated hardwired logic. Alternatively, the functions of the downlink and uplink chains may be performed by the combination of a single, programmable processor, e.g. such as one that is available in the baseband processor 52 (see FIG. 1). In either case, there is said to be a processor that executes stored or encoded program instructions (e.g., that are stored or encoded in external memory 154 of the baseband processor, see FIG. 2) to enhance a voice signal that is being passed through it for purposes of both certification testing and normal end-user scenarios, as follows.

Multi Band Compressor Dynamic Level Adjust

In one embodiment of the invention, a special, audio compressor function (or block) has programmable, multi band, input threshold level adjusting capability (also referred to as multi-band dynamic level adjust). This may improve downlink volume (the perceived loudness of the sound of the downlink signal as it is heard through the receiver or speaker) and reduce acoustic distortion in the downlink signal. The multi-band compressor function may also be applied to enhance other voice communication signals in the device 100, including the microphone output signal as part of the uplink audio signal processing chain. The multi band compressor 314 or 328 (see FIG. 3) may be implemented by a programmable, digital filter whose input is a voice bitstream or a voice sample sequence; its output is an inherently delayed version of the input (inherent delay in a digital filter), with digital filtering having been applied to the sample sequence as described below. This fully digital implementation may be achieved by, for example, suitably programming the baseband processor 52 (see FIG. 2). As an alternative, a partially or entirely analog implementation is possible.

Figures 4, 5:
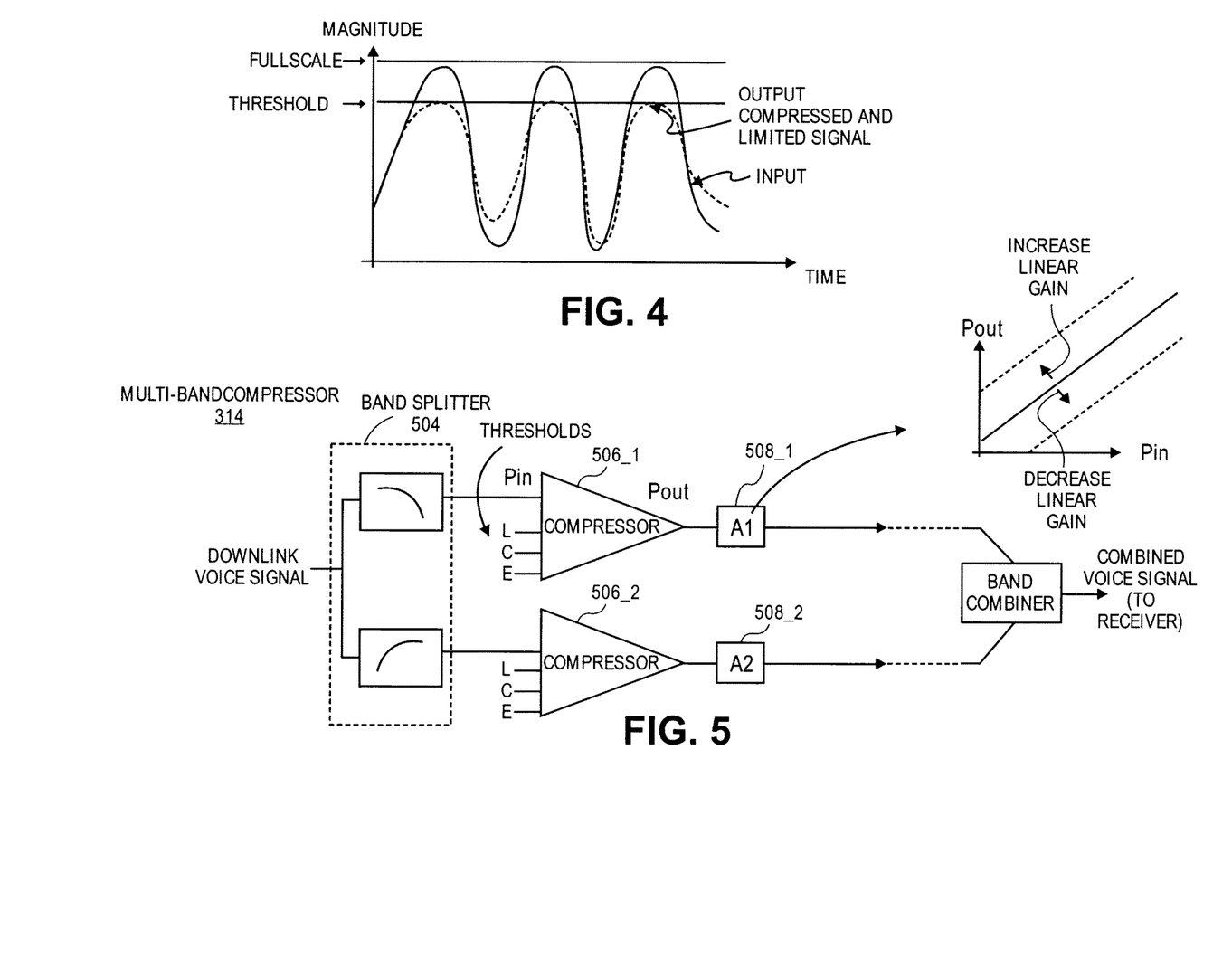
FIG. 4 shows waveforms of an example input signal to a compressor, and the corresponding output signal.
FIG. 5 is a block diagram of a multi-band compressor in accordance with an embodiment of the invention.

A basic function of a compressor block is depicted in FIG. 4, which shows example input and output audio signal waveforms (here, magnitude versus time) to the block. An upper input threshold is set to some level near but below full scale (FS). Whenever the input signal rises above the threshold, the signal is automatically attenuated or limited to some level at or near the threshold as shown. This is not a hard cutoff or hard limiter, but rather a type of gain reduction that is applied to the input signal. For example, the gain, which may be digitally applied to those samples of the input signal that are in and around the interval where the input signal exceeds the threshold, is reduced as needed to achieve a smooth limiting effect as shown in FIG. 4. As an example, when the input signal exceeds the threshold by 1 dB, then the gain applied to the samples within the interval of interest is reduced by around 1 dB.

In addition to compression, the behavior depicted in FIG. 4 also exhibits expansion capability. Specifically, when the input signal dips below a lower threshold, more gain is applied to the desired input samples (note the dotted line rising above the solid line at the lower signal levels). For the sake of convenience, the term "compressor" as used here describes an audio function block that may or may not include expansion capability and hard limiting (in addition to compression).

An embodiment of the invention, as a multi-band audio compressor block 314 with dynamic level adjust capability (in the downlink chain of a wireless communications device), is depicted in block diagram form in FIG. 5. The concepts discussed in connection with FIG. 5 are equally applicable to the multi-band compressor 328 that is in the uplink chain of the device. A band splitter 504 splits the input downlink voice signal into at least two essentially non-overlapping frequency bands, e.g. a low frequency band such as one whose entire signal content is below 1 kHz and a high frequency band such as one whose entire signal content is above 1 kHz. Each of these bands (or band signals) is fed to a separate compressor block 506_1, 506_2 (each of which may have the basic function described above).

Each compressor block 506_1, 506_2 has a respective set of two or more programmable, thresholds. Because of the compression action of the compressor blocks 506 on signal peaks, the acoustic distortion produced by the receiver, upon playing the combined voice signal, is less severe. In addition, the voice signal sounds louder due to the increased gain applied by the expansion action to signal troughs (which raises the RMS or average level of the combined signal), without undue acoustic distortion.

In addition, a linear gain block 508_1, 508_2 may be provided for each band and that may also be variable so that the linear gain A applied to each respective band can be separately adjusted, e.g. increased to obtain a louder sound. Note the behavior of the linear gain block as depicted in the separate graphic of FIG. 5. Increasing or decreasing the linear gain A moves the Pout vs. Pin curve up or down as shown, but does not change its slope.

Figure 6:
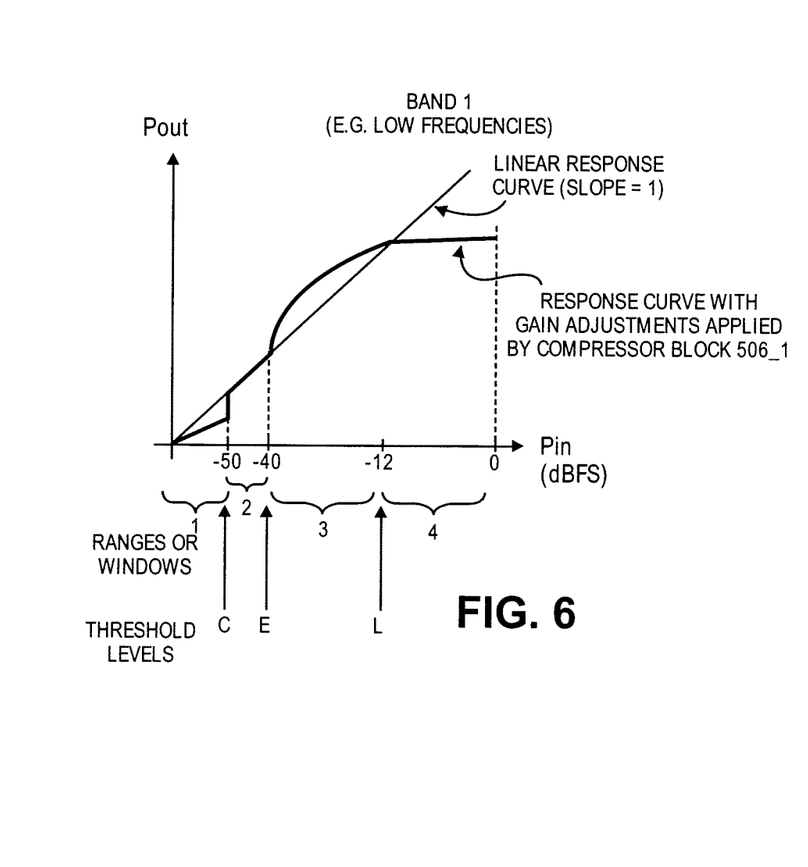
FIG. 6 shows an example behavior of a compressor receiving a low band input signal.
Figure 7:
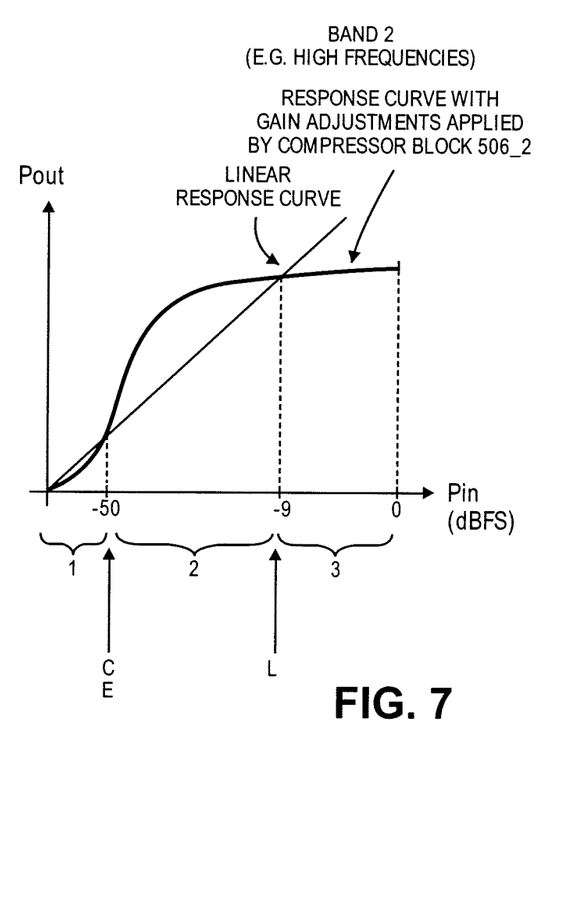
FIG. 7 shows an example behavior of a compressor receiving a high band input signal.

The compressor thresholds for each band are programmable to achieve improved sound quality at the receiver, in accordance with FIG. 6 and FIG. 7. These figures show power at the input to a compressor block 506 (Pin), and power at the output of the compressor 506 (Pout), for the two different bands. In accordance with an embodiment of the invention, the response of the compressor block 506 is adjusted so that it differs from a linear response, in multiple non-overlapping level ranges (or windows), which may be different for different bands. In this example, there are four windows in the low band (FIG. 6), namely very low (1), low (2), medium (3) and high (4). Note the terms low, medium and high are used relative to each other and are thus not otherwise limiting. The high band (FIG. 7) has three windows—low (1), medium (2) and high (3). The windows may be defined by Pin threshold levels, labeled as Limiting (L), Compression (C), and Expansion (E). The terms L, C and E are only used for convenience here to distinguish one threshold from the other and are not otherwise intended to be limiting. In general, the compressor may have two or more signal level windows or ranges for each band, with differing output vs. input slopes in each window.

FIG. 6 shows that for the low band, "strong" compression (limiting) has been programmed to occur for high input levels, at Pin>=L, where L in this example is −12 dB. However, in FIG. 7, it can be seen that for the high band, such limiting does not happen until Pin reaches a higher signal level (in this example −9 dB). This different treatment of low and high bands is consistent with the notion that the receiver of a handheld wireless communications device will likely distort its input audio signal differently in different spectral ranges of the signal. For example, the receiver might distort much more at a lower frequency, e.g. 500 Hz, than at a higher frequency, e.g. 2 KHz. Thus, in the low band, limiting is set to occur when Pin is at a lower signal level than it is in the high band.

In addition, at very low Pin levels, namely in range 1, the signal is likely to be noise. Accordingly, the signal in those ranges should also be subjected to compression (as shown in FIGS. 6-7). The attenuation or gain reduction in this case may be deemed "weak", in contrast to that which is applied at very high Pin levels.

On the other hand, some expansion or gain increase should be applied to Pin levels that are in a middle range, say range 3 in FIG. 6 and range 2 in FIG. 7. The receiver does not distort as much in high band as it does in low band, so the expansion applied in high band (range 2 in FIG. 7) is greater than that applied in low band (range 3 in FIG. 6).

Also, note that there can be a range where the compression is in effect zero in that the frequency response in that range is linear (slope=1). This occurs in range 2 for low band (FIG. 6).

The above described multi-band compressor 506 may be fully programmable in that the level windows or ranges 1, 2, . . . (or their respective thresholds L, C and E), and their respective response curves (e.g., the slope of the response curve within a given input signal level window or range), are all independently programmable, for each frequency band. In other words, for a given manufactured specimen of the mobile device 200 containing the compressor block 506, the slope of the response curve can change across bands, and across signal level ranges within a band. Also, each type of acoustic transducer (e.g., microphone, speaker, receiver, headset microphone) can be assigned its own unique set of response curves as in FIG. 6 and FIG. 7. For example, when processing a microphone signal, the baseband processor 52 would configure or program its audio digital signal processor (DSP) filters to implement the multi-band compressor filtering function that is specifically designed for the microphone. This instruction may come from the applications processor 150, which determines when the device 10 changes operating modes (e.g., when speakerphone mode has been activated and handset mode is deactivated, a compressor function filter suitable for the loudspeaker is configured into the audio DSP of the baseband processor).

In accordance with another embodiment of the invention, other programmable parameters for the compressor function are the attack and decay. Altering such parameters is useful when the function is attempting to recognize for example a peak in the input signal, for purposes of hard limiting above a threshold, or more generally a drop below or increase above a threshold, for purposes of expansion or compression. The attack time (e.g., to be set somewhere in the range 10 microseconds to 1000 microseconds) refers to the time it takes for the function to recognize for example that a threshold has been exceeded by the input signal and then begin to attenuate the output signal. The decay time (e.g., to be set somewhere in the range 20 milliseconds to 100 milliseconds) refers to how long the function waits before it releases the attenuation that is being applied to the output signal. The decay time is generally longer, e.g. by about 100 times, than the chosen attack time.

The compressor function described above may also be implemented in the uplink audio processing chain (see FIG. 3, uplink audio processor 318), to improve the quality of the voice signal obtained from the microphone 216 in situations were the user is a loud talker or is screaming, or if there is a lot of wind noise.

To conclude, various aspects of a technique for giving a developer of a communications device more effective control of sound quality have been described. As explained above, an embodiment of the invention may be a machine-readable medium having stored or encoded thereon instructions which program a processor embedded in the communications device to perform some of the operations described above. In other embodiments, some of these operations might be performed by specific hardware components in the device that contain hardwired logic. Those operations might alternatively be performed by any combination of programmed data processing components and fixed hardware circuit components in the device.

A machine-readable medium may include any mechanism for storing or transferring information in a form readable by a machine (e.g., a computer), such as Compact Disc Read-Only Memory (CD-ROMs), Read-Only Memory (ROMs), Random Access Memory (RAM), and Erasable Programmable Read-Only Memory (EPROM).

The invention is not limited to the specific embodiments described above. For example, the numerical values given in FIG. 6 and FIG. 7 for the Pin thresholds of the compressor blocks may be different, depending on the acoustic characteristics of the particular communications device of which the compressor blocks are a part. Accordingly, other embodiments are within the scope of the claims.

What is claimed is:

1. An audio communications device, comprising:
an uplink or downlink audio processor, the audio processor having a multi band compressor to receive an input uplink or downlink audio signal, the multi-band compressor having a band splitter that is to split the input audio signal into a plurality of different band signals, wherein the plurality of different band signals comprises at least a low band signal and a high band signal; and a plurality of compressor blocks each to receive a respective one of the band signals as input and having a nonlinear frequency response;
wherein each of the compressor blocks specify a plurality of non-overlapping power ranges, which are programmable, that comprises the following:
a first power range, which encompasses a power level of a first temporal segment of the input band signal, across which the compressor block strongly reduces gain applied to the input band signal during the first temporal segment;
a second power range, which encompasses a power level of a second temporal segment of the input band signal, across which the compressor block increases gain applied to the band signal during the second temporal segment; and
a third power range, which encompasses a power level of a third temporal segment of the input band signal, across which the compressor block weakly reduces gain applied to the band signal during the third temporal segment;
wherein power ranges specified by a compressor block that receives the high band signal differ from the power ranges specified by a compressor block that receives the low band signal.

2. The audio communications device of claim 1 wherein the audio processor is an uplink processor and the input audio signal is an uplink signal.

3. The audio communications device of claim 1 wherein the audio processor is a downlink processor and the input audio signal is a downlink signal.

4. The audio communications device of claim 3 wherein the low band signal's entire spectral content is below 1 kHz, and the high band signal's entire spectral content is above 1 kHz.

5. The audio communications device of claim 3 further comprising a plurality of programmable linear gain blocks each to operate upon a respective one of the plurality of band signals.

6. An audio communications device, comprising:
an uplink or downlink audio processor, the audio processor having
a multi band compressor to receive an input, uplink or downlink, audio signal, the multi-band compressor having a band splitter that is to split the input audio signal into a plurality of different band signals, wherein the plurality of different band signals comprises at least a low band signal and a high band signal; and
a plurality of compressor blocks each to receive a respective one of the band signals as input, each of the compressor blocks having a nonlinear frequency response;
wherein each of the compressor blocks specify a plurality of non-overlapping power ranges, which are programmable, that comprises the following:
a first power range, which encompasses a power level of a first temporal segment of the input band signal, across which the compressor block strongly reduces gain applied to the input band signal during the first temporal segment;
a second power range, which encompasses a power level of a second temporal segment of the input band signal, across which the compressor block increases gain applied to the band signal during the second temporal segment; and
a third power range, which encompasses a power level of a third temporal segment of the input band signal, across which the compressor block weakly reduces gain applied to the band signal during the third temporal segment;
wherein power ranges specified by a compressor block that receives the high band signal differ from the power ranges specified by a compressor block that receives the low band signal.

7. The audio communications device of claim 6 wherein the audio processor is an uplink processor and the input audio signal is an uplink signal.

8. The audio communications device of claim 6 wherein the audio processor is a downlink processor and the input audio signal is a downlink signal.

9. The audio communications device of claim 8 wherein the low band signal's entire spectral content is below 1 kHz, and the high band signal's entire spectral content is above 1 kHz.

10. The audio communications device of claim 6 wherein in the plurality of compressor blocks, another one of the non-overlapping windows exhibits a linear response.

11. An audio communications device, comprising:
means for processing an input, uplink or downlink, audio signal, including
means for splitting the input audio signal into a plurality of different band signals, wherein the plurality of different band signals comprises at least a low band signal and a high band signal;
first nonlinear means for filtering one of the different band signals, the first filtering means being programmable so that its audio frequency response differs in at least two non-overlapping windows of said one of the different band signals; and
second nonlinear means for filtering another one of the different band signals, the second filtering means being independently programmable from the first filtering means so that its audio frequency response differs from that of the first filtering means;
wherein both the first nonlinear means and the second nonlinear means specify a plurality of non-overlapping power ranges, which are programmable, that comprises the following:
a first power range, which encompasses a power level of a first temporal segment of the input band signal, across which the non-linear means strongly reduces gain applied to the input band signal during the first temporal segment;
a second power range, which encompasses a power level of a second temporal segment of the input band signal, across which the non-linear means increases gain applied to the band signal during the second temporal segment; and
a third power range, which encompasses a power level of a third temporal segment of the input band signal, across which the non-linear means weakly reduces gain applied to the band signal during the third temporal segment;
wherein power ranges specified by the first nonlinear means differ from the power ranges specified by the second nonlinear means.

* * * * *